(12) United States Patent
Ohta

(10) Patent No.: US 8,917,342 B2
(45) Date of Patent: Dec. 23, 2014

(54) SOLID-STATE IMAGING ELEMENT, METHOD FOR PRODUCING SOLID-STATE IMAGING ELEMENT, AND ELECTRONIC DEVICE

(75) Inventor: Kazuo Ohta, Kanagawa (JP)

(73) Assignee: Sony Corporation, Tokyo (JP)

( * ) Notice: Subject to any disclaimer, the term of this patent is extended or adjusted under 35 U.S.C. 154(b) by 371 days.

(21) Appl. No.: 13/344,059

(22) Filed: Jan. 5, 2012

(65) Prior Publication Data

US 2012/0188397 A1 Jul. 26, 2012

(30) Foreign Application Priority Data

Jan. 26, 2011 (JP) ................................. 2011-014110

(51) Int. Cl.
*H04N 5/335* (2011.01)
*H01L 31/062* (2012.01)
*H01L 21/00* (2006.01)
*H01L 27/146* (2006.01)

(52) U.S. Cl.
CPC ...... *H01L 27/1464* (2013.01); *H01L 27/14641* (2013.01); *H01L 27/14627* (2013.01); *H01L 27/14638* (2013.01); *H01L 27/14621* (2013.01); *H01L 27/1463* (2013.01)
USPC .............................. 348/308; 257/292; 438/73

(58) Field of Classification Search
None
See application file for complete search history.

(56) References Cited

U.S. PATENT DOCUMENTS

| 7,989,859 | B2 * | 8/2011 | Mao et al. ................. 257/292 |
| 8,618,458 | B2 * | 12/2013 | McCarten et al. ........ 250/208.1 |
| 2002/0190288 | A1 * | 12/2002 | Lee et al. ................. 257/292 |
| 2006/0042677 | A1 * | 3/2006 | Fukunaga et al. ......... 136/243 |
| 2008/0246853 | A1 * | 10/2008 | Takizawa et al. ......... 348/222.1 |
| 2011/0108709 | A1 * | 5/2011 | Park et al. ............... 250/214 AL |

FOREIGN PATENT DOCUMENTS

| JP | 2007-258684 | 10/2007 |
| JP | 2008-182142 | 8/2008 |

* cited by examiner

*Primary Examiner* — Luong T Nguyen
(74) *Attorney, Agent, or Firm* — Dentons US LLP

(57) ABSTRACT

A solid-state imaging element includes a wiring layer; a charge accumulation unit including a semiconductor layer provided on the wiring layer; and a photoelectric conversion film provided on the semiconductor layer, wherein a pinning layer of a conductivity type opposite to a conductivity type of the charge accumulation unit, the pinning layer including an opening, is provided in a region of the charge accumulation unit, the region being located at an interface between the charge accumulation unit and the photoelectric conversion film.

13 Claims, 9 Drawing Sheets

SOLID-STATE IMAGING ELEMENT, METHOD FOR PRODUCING SOLID-STATE IMAGING ELEMENT, AND ELECTRONIC DEVICE

BACKGROUND

The present disclosure relates to a solid-state imaging element having a multilayer structure including a photoelectric conversion unit and a wiring layer, a method for producing the solid-state imaging element, and an electronic device including the solid-state imaging element.

In a solid-state imaging element in which a plurality of photoelectric conversion units are arranged, proposed structures for successfully improving the optical sensitivity and achieving a higher pixel density include, for example, a back-illuminated structure. In a back-illuminated solid-state imaging element, the photoelectric conversion units are provided in the back surface of a semiconductor substrate, the back surface being opposite to the front surface on which circuitry, wiring, and the like are provided, and thus incident light is received by the photoelectric conversion units through the back surface. Sensitivity can be improved in such a back-illuminated solid-state imaging element, because the circuitry, wiring, and the like, which block or reflect incident light, are not provided on the light-receiving side of the element (for example, see Japanese Unexamined Patent Application Publication No. 2008-182142).

Further, in the above-described back-illuminated solid-state imaging element, it has been proposed to provide a control gate electrode on a surface opposite to the light-receiving surface in the photoelectric conversion units, and to apply voltage to the photoelectric conversion units to control potential and efficiently transfer signal charges (for example, see Japanese Unexamined Patent Application Publication No. 2007-258684).

SUMMARY

However, in a back-illuminated solid-state imaging element, signal charges are read out from a photoelectric conversion unit in the semiconductor substrate to a charge accumulation unit and a read-out circuit that are provided to the surface on the side opposite to that photoelectric conversion unit. The semiconductor substrate is therefore thinned, and incident light from the surface of the photoelectric conversion unit in the semiconductor substrate is prone to pass through that photoelectric conversion unit and be incident on the charge accumulation unit and the read-out circuit. Such light incidence sometimes generates the defect where noise is created and the quality of captured images is reduced.

It is therefore desirable to provide a solid-state imaging element having a multilayer configuration including a photoelectric conversion unit and a wiring layer in which noise generation can be prevented and image quality can be enhanced, to provide a method for producing the solid-state imaging element, and to provide an electronic device including the solid-state imaging element.

A solid-state imaging element according to an embodiment of the present disclosure includes a wiring layer; a charge accumulation unit including a semiconductor layer provided on the wiring layer; and a photoelectric conversion film provided on the semiconductor layer, wherein a pinning layer of a conductivity type opposite to a conductivity type of the charge accumulation unit, the pinning layer including an opening, is provided in a region of the charge accumulation unit, the region being located at an interface between the charge accumulation unit and the photoelectric conversion film.

In a solid-state imaging element having such a configuration, because the photoelectric conversion film is provided on the semiconductor layer constituting the charge accumulation unit, the use of a film having high absorptivity as the photoelectric conversion film inhibits transmittance of incident light through the photoelectric conversion film to the semiconductor layer. The generation of noise from light illumination onto the charge accumulation unit made up of the semiconductor layer is thereby prevented. Furthermore, providing the pinning layer of a conductivity type opposite to that of the charge accumulation unit in a region of the charge accumulation unit, the region being located at the interface between the charge accumulation unit and the photoelectric conversion film, compensates for the defect level in the region of the charge accumulation unit made up of the semiconductor layer. The generation of noise caused by the defect level is thereby prevented. Signal charges that are created in the photoelectric conversion film move to and accumulate in the charge accumulation unit, which is joined to the photoelectric conversion film via the opening provided in the pinning layer.

According to an embodiment of the present disclosure, there is provided a method for producing a solid-state imaging element having such a configuration. The method includes forming a charge accumulation unit in a front surface of a semiconductor substrate; forming a wiring layer on the front surface of the semiconductor substrate in which the charge accumulation unit has been formed; thinning the semiconductor substrate from a back surface of the semiconductor substrate until the charge accumulation unit is exposed to provide a semiconductor layer having an exposed surface; forming a photoelectric conversion film on the exposed surface of the semiconductor layer; and prior to the formation of the photoelectric conversion film, forming a pinning layer of a conductivity type opposite to a conductivity type of the charge accumulation unit, the pinning layer including an opening, in a region of the charge accumulation unit, the region being located at an interface between the charge accumulation unit and the photoelectric conversion film.

This production method provides the solid-state imaging element having the above-described configuration.

As has been described above, according to an embodiment of the present disclosure, in a configuration in which a photoelectric conversion unit is formed on a wiring layer with a charge accumulation unit therebetween, it is possible to prevent the generation of noise from light illumination onto the charge accumulation unit including the semiconductor layer, and the generation of noise caused by the defect level at the interface region of the charge accumulation unit including the semiconductor layer. It is thereby possible to improve image quality in the solid-state imaging element, the configuration of which succeeds in improving optical sensitivity and increasing a pixel density, and in an electronic device including the solid-state imaging element.

DETAILED DESCRIPTION OF EMBODIMENTS

Figure 1:
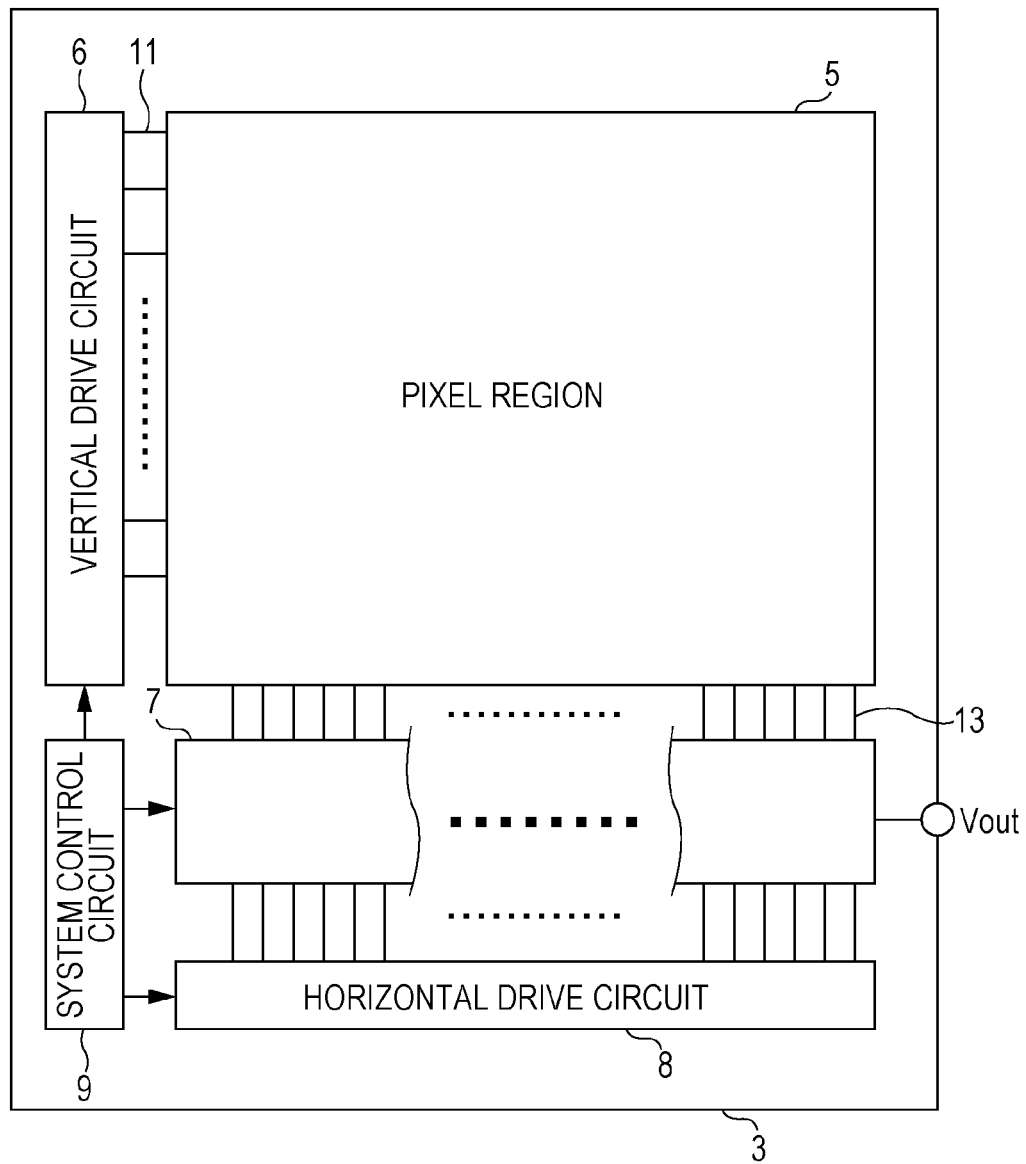
FIG. 1 is a schematic diagram illustrating the configuration of a solid-state imaging element according to an embodiment of the present disclosure.

Embodiments of the present disclosure are illustrated in the following order on the basis of the drawings.

1. An example of the schematic configuration of the solid-state imaging elements of embodiments;
2. The configuration of the solid-state imaging element of the first embodiment;
3. A first example of the method for producing the solid-state imaging element of the first embodiment;
4. A second example of the method for producing the solid-state imaging element of the first embodiment;
5. The configuration of the solid-state imaging element of the second embodiment (an example in which pinning openings and transfer gates are superposed);
6. The configuration of the solid-state imaging element of the third embodiment (an example in which pinning openings are provided in the centers of pixels); and
7. An embodiment of an electronic device.

Note that elements that are shared among the embodiments and modifications are given the same reference numeral, and repeating descriptions have been omitted.

1: An example of the schematic configuration of the solid-state imaging elements of embodiments FIG. 1 illustrates the schematic configuration of a MOS-type solid-state imaging element serving as an example of solid-state imaging elements produced by production methods according to various embodiments of the present disclosure.

The solid-state imaging element 1 illustrated in FIG. 1 has a support substrate 3, which has a surface provided with a pixel region 5 on which a plurality of pixels including a photoelectric conversion unit are arranged regularly in two dimensions. Each pixel arranged in the pixel region 5 is provided with a photoelectric conversion unit; a charge accumulation unit; and a pixel circuit constituted of a plurality of transistors (so-called MOS transistors), capacitive elements, and the like. Note that in some cases, a part of a pixel circuit is shared by a plurality of pixels.

The peripheral portion of the pixel region 5 described above is provided with peripheral circuits, such as a vertical drive circuit 6, a column signal processing circuit 7, a horizontal drive circuit 8, and a system control circuit 9.

The vertical drive circuit 6, which is constituted of, for example, a shift register, selects a pixel drive line 11 and feeds to the selected pixel drive line 11 a pulse for driving pixels, thus driving the pixels arranged in the pixel region 5 one line at a time. That is, the vertical drive circuit 6 sequentially selects and scans pixels arranged in the pixel region 5 one line at a time in the vertical direction. Further, a pixel signal that is based on a signal charge that is generated in accordance with the amount of light received in each pixel is supplied through a vertical signal line 13 disposed perpendicular to the pixel drive line 11, to the column signal processing circuit 7.

The column signal processing circuit 7 is disposed for, for example, each column of the pixels, and performs signal processing such as noise removal in each column of pixels for signals that are outputted from one column of pixels. That is, the column signal processing circuit 7 performs signal processing such as correlated double sampling (CDS) in order to remove pixel-specific fixed pattern noise, as well as signal amplification, analog/digital conversion (AD conversion), and the like.

The horizontal drive circuit 8, which is constituted of, for example, a shift register, selects each column signal processing circuit 7 in order by sequentially outputting horizontal scanning pulses, and causes a pixel signal to be outputted from each column signal processing circuit 7.

The system control circuit 9 receives an input clock and data commanding an operational mode or the like, and also outputs data such as internal information of the solid-state imaging element 1. That is, clock signals and control signals acting as references for the operations of the vertical drive circuit 6, the column signal processing circuits 7, the horizontal drive circuit 8, and the like are generated in the system control circuit 9 on the basis of vertical synchronizing signals, horizontal synchronizing signals, and a master clock. These signals are inputted into the vertical drive circuit 6, the column signal processing circuits 7, the horizontal drive circuit 8, and the like.

The drive circuit for driving pixels is constituted of the peripheral circuits 6 to 9 described above, and of the pixel circuits provided to the pixel region 5. The peripheral circuits 6 to 9 may be arranged so as to overlap the pixel region 5.

2: The configuration of the solid-state imaging element of the first embodiment

Figure 2:
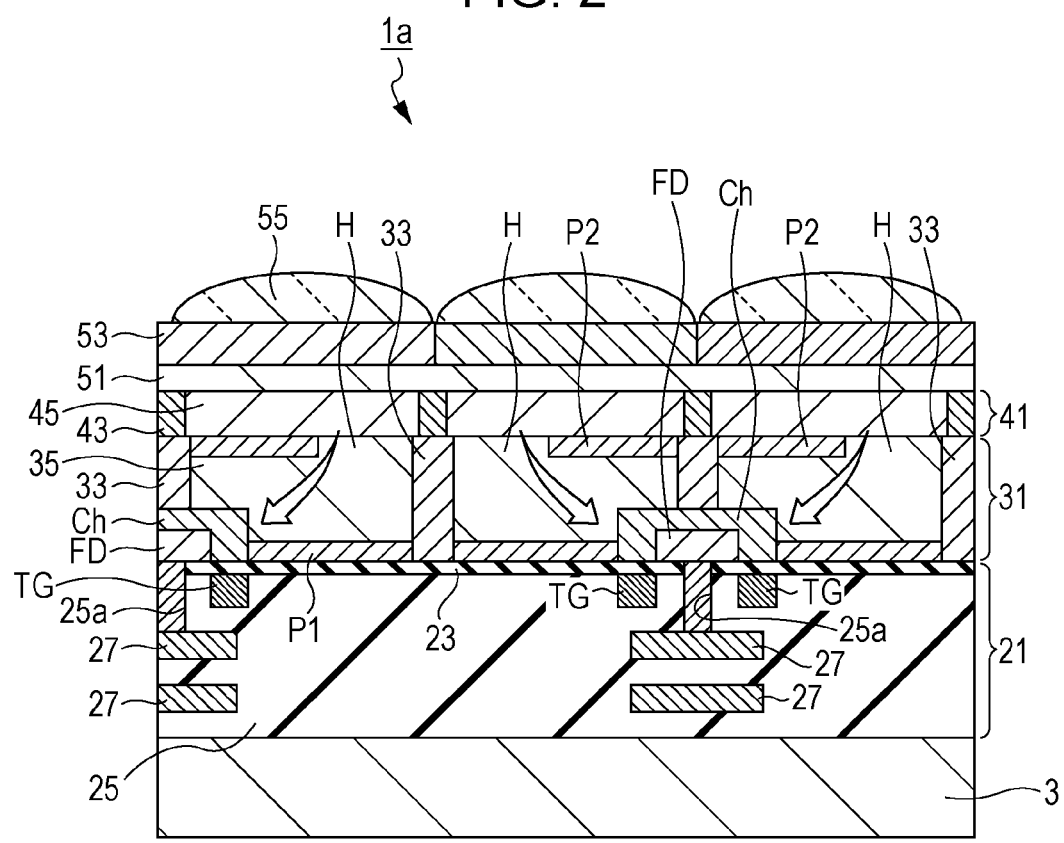
FIG. 2 is a cross-sectional view illustrating a partial configuration of the solid-state imaging element of a first embodiment.

FIG. 2 is a cross-sectional drawing illustrating a partial configuration of the solid-state imaging element of the first embodiment, and is a cross-sectional diagram of three pixels in the pixel region 5 in FIG. 1. The solid-state imaging element 1a illustrated in FIG. 1 has a support substrate 3 onto which a wiring layer 21, a semiconductor layer 31, a photoelectric conversion film 41, a protective film 51, a color filter layer 53, and an on-chip lens 55 are stacked in this order. The following is a description of the configuration in order from the lowest layer.

Support Substrate 3

The support substrate 3 serves as the support substrate of the solid-state imaging element, formed using a suitable material, such as a glass substrate, a semiconductor substrate, a plastic substrate, or the like.

Wiring Layer 21

The wiring layer 21 has, for example, a multilayer wiring structure. The wiring layer 21 has transfer gates TG. Each transfer gate TG is provided in a region of the wiring layer 21, the region being located at the interface between the wiring layer 21 and the semiconductor layer 31, with a gate insulation film 23 provided between the transfer gate TG and the semiconductor layer 31. The transfer gate TG is provided to each pixel and is covered by an inter-layer insulation film 25. The wiring layer 21 includes multiple layers of wiring 27, the layers being insulated by the inter-layer insulation film 25. A part of the inter-layer insulation film 25 and the gate insulation film 23 is provided with a connection hole 25a reaching the semiconductor layer 31, and the wiring 27 is connected to the semiconductor layer 31 via the connection hole 25a.

Semiconductor Layer 31

The semiconductor layer 31 is a thin-film layer having a single-crystal structure, in which a semiconductor substrate made up of, for example, single-crystal silicon has been thinned. The semiconductor layer 31 is separated into a plurality of charge accumulation units 35 that are isolated from each other by an element isolation 33 provided across the depth direction. Each charge accumulation unit 35 is made up of, for example, an n+-type impurity layer or a p+-type impurity layer, and is disposed so as to correspond to a pixel. The following is a description taking one example in which the charge accumulation unit 35 is made up of an n+-type impurity layer. In such a case, the element isolation 33 may be made up of a p+-type impurity layer, or alternatively may be a shallow trench isolation (STI).

A floating diffusion FD is provided in a region of the semiconductor layer 31, the region being located at the interface between the semiconductor layer 31 and the wiring layer 21. The floating diffusion FD is made up of an n-type impurity layer that has been partitioned from the charge accumulation units 35 by a channel region Ch made up of a p-type impurity layer. The floating diffusion FD is provided so as to be shared by a plurality of charge accumulation units 35; the illustration herein is of a state in which a single floating diffusion FD is shared by the charge accumulation units 35 of two adjacent pixels. A part of the element separation 33 described above is thereby provided in contact with the channel region Ch.

Further, a part of the wiring 27 provided in the wiring layer 21 is connected to the floating diffusion FD. Moreover, each transfer gate TG provided in the wiring layer 21 is disposed so as to correspond to the channel region Ch located between the floating diffusion FD and the charge accumulation units 35.

A first pinning layer P1 that covers the charge accumulation unit 35 is provided in a region of the semiconductor layer 31, the region being located at the interface between the semiconductor layer 31 and the wiring layer 21. The first pinning layer P1 is made up of a layer of impurities having a conductivity type (herein, p-type) opposite to that of the charge accumulation unit 35, and has a thin film thickness.

On the other hand, a second pinning layer P2, which is a feature of this first embodiment, is provided in a region of the semiconductor layer 31, the region being located at the interface between the semiconductor layer 31 and the photoelectric conversion film 41. The second pinning layer P2 is made up of a layer of impurities having a conductivity type opposite to that of the charge accumulation unit 35; such a second pinning layer P2, which herein is made up of a p+-type impurity layer with a boron concentration on the order of $10^{19}$ atoms/cm$^3$, has a very thin film thickness.

It is a particular feature that the second pinning layer P2 is provided in a partially opened state covering the charge accumulation unit 35; the charge accumulation unit 35 constituted of the semiconductor layer 31 is directly connected with the photoelectric conversion film 41 through the opening H. For example, the opening H of the second pinning layer P2 is disposed so as not to be overlapped by the floating diffusion FD when the element is seen in plan view from the support substrate 3.

Due to the above, the interface regions of the semiconductor layer 31, the interface regions being located at the interface between the semiconductor layer 31 and the wiring layer 21 and at the interface between the semiconductor layer 31 and the photoelectric conversion film 41, are covered by the first pinning layer P1 and the second pinning layer P2, which are made up of p+-type impurity layers, and the element isolation 33, with the exceptions of the opening H facing the photoelectric conversion film 41, the floating diffusion FD, and the channel region Ch.

Although an illustration herein has been omitted, the interface between the semiconductor layer 31 and the wiring layer 21 described above is provided with a transistor Tr and a capacitive element, which include an electrode made up of the same layers as the impurity layers, the gate insulation film, and the transfer gate. The wiring layer 21 is further provided with wiring connecting these elements, and constitutes the above-described pixel circuits and peripheral circuits. It is particularly appropriate to use a global shutter circuit for the solid-state imaging element 1a of this embodiment. The configuration of the global shutter circuit used herein is not limited, and there are various configurations of global shutter circuits that can be applied.

Photoelectric Conversion Film 41

The photoelectric conversion film 41 is a layer that is deposited onto the semiconductor layer 31. The photoelectric conversion film 41 is separated into a plurality of photoelectric conversion units 45 isolated from each other by an element isolation 43 provided across the depth direction. Each photoelectric conversion unit 45 is disposed so as to correspond to a pixel; it is important that a single photoelectric conversion unit 45 be joined with the opening H of the second pinning layer P2 in a single charge accumulation unit 35. Note that the element isolation 43 may be made up of a layer of impurities of a conductivity type opposite to that of the photoelectric conversion unit 45, or may alternatively be a shallow trench isolation (STI).

It is important that the photoelectric conversion film 41 be constituted of a material having a higher optical absorption coefficient for visible light than the semiconductor layer 31; the higher the absorption coefficient, the more preferable. Also, the photoelectric conversion film 41 is preferably provided so as to be lattice-matched to the semiconductor layer 31. The photoelectric conversion film 41 can thereby be made to have a high crystallinity and superior photoelectric conversion efficiency, and also the interface state between the photoelectric conversion film 41 and the charge accumulation unit 35 in the semiconductor layer 31 can be kept low. In so doing, it is preferable to use an epitaxial growth layer formed on the semiconductor layer 31, to serve as the photoelectric conversion film 41 that has been lattice-matched to the semiconductor layer 31.

The material for the photoelectric conversion film 41 as described above is appropriately selected from among, for example, (1) compound semiconductor materials, (2) silicide-based materials, and (3) organic materials. Examples of the materials (1) to (3) constituting the photoelectric conversion film 41 are described below in a case in which the semiconductor layer 31 is made up of single-crystal silicon.

(1) A compound semiconductor material having a chalcopyrite structure is used as a particular example of a compound semiconductor material. A preferred example for use as the photoelectric conversion film 41 is a compound semiconductor material having a chalcopyrite structure, which has a high optical absorption coefficient, and is a material that allows for a high degree of sensitivity over a broad wavelength region. Such a semiconductor material having a chalcopyrite structure is composed of the elements around Group IV, such as Cu, Al, Ga, In, Zn, S, and Se; examples include CuInSe-based mixed crystal, CuGaInS-based mixed crystal, CuAlGaInS-based mixed crystal, CuAlGaInSSe-based mixed crystal, and CuAlGaInZnSSe-based mixed crystal. Other than a single crystal structure, the photoelectric conversion film 41 composed of such a compound semiconductor material may have a polycrystalline or amorphous structure.

Of the above-mentioned compound semiconductor materials, the use of $CuInSe_2$ is to be preferred, from the standpoint of the optical absorption coefficient. $CuInSe_2$ has a higher optical absorption coefficient than other materials; in particular, the optical absorption coefficient thereof is approximately two orders of magnitude higher than that of single-crystal silicon. For this reason, when the photoelectric conversion film 41 is composed of $CuInSe_2$, it serves as a photoelectric conversion film 41 suitably having the function of blocking visible light.

Further, of the above compound semiconductor materials, the use of the following compositions is preferred in a case in which the semiconductor layer 31 is made up of single-crystal silicon, from the standpoint of lattice-matching to the semiconductor layer 31.

$Cu(Ga_{0.52}In_{0.48})S_2$
$Cu(Al_{0.24}Ga_{0.23}In_{0.53})S_2$
$Cu(Al_{0.36}Ga_{0.64})(S_{1.28}Se_{0.72})$ (2) Examples of silicide-based materials include CoSi, CrSi, HfSi, IrSi, MoSi, NiSi, PdSi, ReSi, TaSi, TiSi, WSi, ZrSi, β-iron silicide materials (β-$FeSi_2$), and barium silicide-based materials ($BaSi_2$, BaSrSi).

Of the above silicide-based materials, the use of β-iron silicide materials (β-$FeSi_2$) and barium silicide-based materials ($BaSi_2$, BaSrSi) is preferred, from the standpoint of the optical absorption coefficient. These materials have optical absorption coefficients that are approximately two orders of magnitude greater than that of single-crystal silicon, and therefore are preferred as the material constituting the photoelectric conversion film 41 having the function of blocking visible light.

(3) Preferred examples of organic materials include quinacridone-based and coumarin-based organic materials. These materials have optical absorption coefficients that are approximately two orders of magnitude greater than that of single-crystal silicon, and therefore are preferred as the material constituting the photoelectric conversion film 41 having the function of blocking visible light.

The photoelectric conversion film 41 is preferably formed so as to have the band that slopes in the depth direction toward the semiconductor layer 31, in order for the charge generated by each photoelectric conversion unit 45 to be easily moved via the opening H of the second pinning layer P2 into the charge accumulation unit 35 constituted of the semiconductor layer 31. For example, in a case in which the charge accumulation unit 35 is made up of an n-type impurity layer, the depth-direction concentration and composition of impurities in the charge accumulation unit 35 are adjusted so as to facilitate the movement of an electron generated in the photoelectric conversion unit 45 into the charge accumulation unit 35. Provided that the above conditions are met, such a photoelectric conversion film 41 may be any of the p-type, i-type, and n-type.

A specific example is described in which the photoelectric conversion film 41 is formed of $Cu(Ga_{0.52}In_{0.48})S_2$ having a chalcopyrite structure. In such a case, in contrast to an n-type charge accumulation unit 35 constituted of the semiconductor layer 31, a photoelectric conversion unit 45 constituted of a photoelectric conversion film 41 formed of $Cu(Ga_{0.52}In_{0.48})S_2$ will be of the p-type. Therefore, the photoelectric conversion film 41 (the photoelectric conversion unit 45) contains Zn in a concentration gradient in the depth direction such that the concentration of Zn, which is an n-type impurity, increases closer to the semiconductor layer 31, relative to the $Cu(Ga_{0.52}In_{0.48})S_2$. When the film thickness of the photoelectric conversion film 41 is on the order of 300 nm, the concentration of Zn, which is an n-type impurity, is on the order of $10^{14}$ to $10^{16}$ atoms/cm$^3$. The band thereby takes on a sloping configuration so as to facilitate electron movement from the p-type photoelectric conversion unit 45 to the n-type charge accumulation unit 35.

As above, in a case in which the photoelectric conversion film 41 is formed of a material having a chalcopyrite structure, providing an element around Group IV in the photoelectric conversion film 41 so as to have a concentration gradient in the depth direction allows the band to be given a slope in the depth direction.

Protective Film 51

The protective film 51 is a film of a passivating material, or otherwise, when the photoelectric conversion film 41 has a crystalline structure, is a film of a material having a fixed charge in order to compensate for the defect level thereof.

Examples of films of passivating materials include ordinary silicon oxide film, silicon nitride film, and silicon oxynitride film.

On the other hand, when, for example, the photoelectric conversion film 41 is of the n-type, a film of a material having a negative fixed charge is deposited as the film of a material having a fixed charge, and when the photoelectric conversion film 41 is of the p-type, a film of a material having a positive fixed charge is used.

As one example, a metallic oxide film or silicon-based material film is used as a film of a material having a negative fixed charge. In the case of metallic oxide films, the material is preferably a material that itself has a negative fixed charge; for example, a transition metal oxide film is used. In particular, the use of hafnium oxide ($HfO_2$), zirconium oxide ($ZrO_2$), aluminum oxide ($Al_2O_3$), titanium oxide ($TiO_2$), or tantalum oxide ($Ta_2O_5$) is preferred. In the case of silicon-based material films, the material is preferably a material that itself has a negative fixed charge; the use of a silicon oxide film containing boron, phosphorous, or other impurities is preferred. Particular examples are boron-containing silicon oxide (BSG), phosphorous-containing silicon oxide (PSG), and boron- and phosphorous-containing silicon oxide (BPSG).

The film of a material having a negative fixed charge as described above is preferably formed as a carbon-containing film, by deposition using an organic metal or organic silane gas; the negative fixed charge in the film can thereby be further increased (see Japanese Unexamined Patent Application Publication No. 2010-67736).

In addition to the above, for example, a transparent electrode material film can be used as the film of a material having a negative fixed charge. When the photoelectric conversion film 41 is of the n-type, applying a negative voltage to a protective film 51 made up of a transparent electrode material film allows the use of the protective film 51 as a film having a negative fixed charge.

Examples of films of materials having a positive fixed charge also include transparent electrode material films. When the photoelectric conversion film 41 is of the p-type, applying a positive voltage to a protective film 51 made up of a transparent electrode material film allows the use of the protective film 51 as a film having a positive fixed charge.

The above-described protective film 51 may have either a monolayer structure or a multilayer structure. In the case of a multilayer structure, a film of a passivating material may be formed on the film of a material having a fixed charge.

Color Filter Layer 53

The color filter layer 53 includes color filters having colors provided in a one-to-one relationship with the photoelectric conversion units 45. There is no limitation to the arrangement of the color filters having colors.

On-Chip Lens 55

The on-chip lenses 55 are provided in a one-to-one relationship with the photoelectric conversion units 45 and with the color filters having colors constituting the color filter layer 53, and are configured such that incident light is focused onto the photoelectric conversion units 45.

In the solid-state imaging element 1a constituted as described above, the photoelectric conversion film 41 is provided on the semiconductor layer 31 constituting the charge accumulation unit 35. Therefore, the use of a film having favorable optical absorption as the photoelectric conversion film 41 inhibits light that is incident on the photoelectric conversion film 41 from being transmitted onto the semiconductor layer 31. The generation of noise from the illumination of light onto the charge accumulation unit 35 made up of the semiconductor layer 31 can thereby be prevented.

Yet, when the second pinning layer P2 of a conductivity type opposite to that of the charge accumulation unit 35 is provided in a region of the charge accumulation unit 35, the region being located at the interface between the charge accumulation unit 35 and the photoelectric conversion film 41, the interface can be given a fixed potential—for example, 0 V or a negative potential, thus obtaining a pinning effect due to a virtual gate. The defect level of an interface region of the charge accumulation unit 35 made up of the semiconductor layer 31, the interface region being located at the interface between the charge accumulation unit 35 and the photoelectric conversion film 41, is thereby compensated for. As illustrated by the arrows in FIG. 2, signal charges generated by the photoelectric conversion film 41 move to and are accumulated in the charge accumulation units 35, which are joined to the photoelectric conversion film 41 via the openings H provided in the second pinning layer P2. Accordingly, charges are not hindered from moving from the photoelectric conversion unit 45 in the photoelectric conversion film 41 to the charge accumulation unit 35, and it is possible to prevent the generation of a dark current caused by the defect level of the interface, and the generation of white spots thereby.

As a result of the above, it is possible to prevent the generation of noise and to improve image quality in the solid-state imaging element 1a, which has a multilayer configuration including the photoelectric conversion unit 45 and the wiring layer 21, the multilayer configuration allowing for improvement in optical sensitivity and increase in a pixel density.

Especially in a solid-state imaging element 1a that is provided with a global shutter circuit and that captures images with a global shutter mode, exposure is carried out simultaneously in all the pixels each provided with the photoelectric conversion unit 45, and signal charges are temporarily accumulated in each charge accumulation unit 35. Therefore, although a noticeable amount of noise is generated when light is incident onto the charge accumulation unit 35, such generation of noise can be reliably prevented by the application of this first embodiment. Accordingly, this first embodiment can provide the effect of remarkably improving image quality in the solid-state imaging element 1a for capturing images in the global shutter mode.

3: A first Example of the Method for Producing the Solid-State Imaging Element of the First Embodiment FIGS. 3A to 4C are cross-sectional views serving to describe the steps of a first example of the method for producing a solid-state imaging element of the first embodiment. The following is a description of the first example of the method for producing the solid-state imaging element of the first embodiment, on the basis of these drawings.

FIG. 3A

Figure 3A:
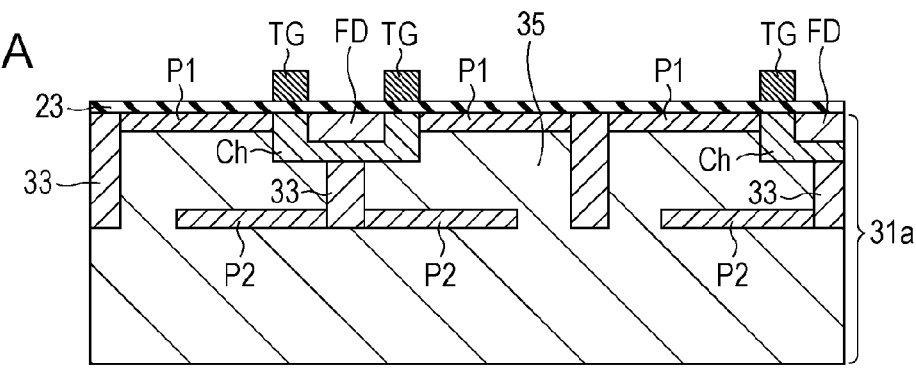
FIGS. 3A to 3C are cross-sectional views illustrating steps of a first example of a production method employed for the first embodiment.

First, as illustrated by FIG. 3A, for example, a single-crystal silicon substrate of the n-type is prepared as the semiconductor substrate 31a.

In the surface layer of the semiconductor substrate 31a, the previously described element isolation 33, the first pinning layer P1, and the second pinning layer P2 made up of p+-type impurity layers are formed; a channel region Ch made up of a p-type impurity layer is further formed; a floating diffusion FD and the charge accumulation unit 35 made up of n+-type impurity layers are also formed.

Each of the p+-type impurity layers, p-type impurity layer, and n+-type impurity layers is formed by introducing impurities from the surface side of the semiconductor substrate 31a, for example, ion implantation into the semiconductor substrate 31a from above a mask, and subsequent thermal-activation treatment. In the case of the p+-type impurity layers and the p-type impurity layer, the ion implantation of p-type impurities like boron (B) is performed. On the other hand, in the case of the n+-type impurity layers, the ion implantation of n-type impurities like arsenic (As) is performed. The ions are implanted with an implantation energy suitably set to match the depth of an impurity layer to be formed.

For example, in the formation of the second pinning layer P2, which has the openings H, a mask for covering the portions corresponding to the openings H is formed on the surface of the semiconductor substrate 31a, and the ions are implanted into the semiconductor substrate 31a from above the mask. Also, the second pinning layer P2, which is formed at a deeper position than the first pinning layer P1, is formed by an ion implantation set to have a higher implantation energy than that in the formation of the first pinning layer P1. The second pinning layer P2 is thereby formed to be made up of, for example, a p+-type impurity layer having a boron concentration on the order of $10^{19}$ atoms/cm$^3$.

Next, a gate insulation film 23 constituted by a silicon oxide film or a silicon nitride film is deposited onto the surface of the semiconductor substrate 31a in which the charge accumulation unit 35 is formed; a transfer gate TG composed of polysilicon is further formed on the gate insulation film 23.

There is no particular limitation to the step order in the steps so far, which can be performed in any appropriate order. For example, after the transfer gate TG has been formed on the gate insulation film 23, ions may be implanted in order to form the floating diffusion FD or the first pinning layer P1 using the transfer gate TG as the mask. The element isolation 33 is also not limited to one made up of an impurity layer, and may be formed as a shallow trench isolation.

FIG. 3B

Figure 3B:
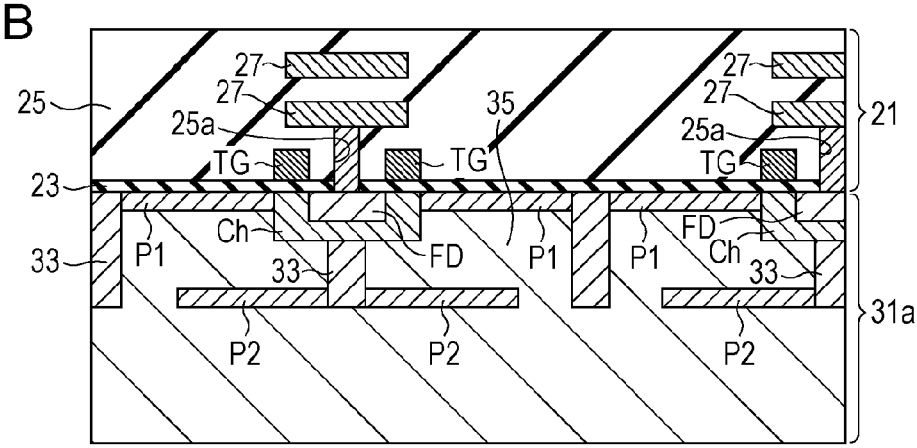

Next, as illustrated in FIG. 3B, an inter-layer insulation film 25 is formed on the semiconductor substrate 31a so as to cover the transfer gate TG; a connection hole 25a that reaches the floating diffusion FD is also formed in the inter-layer insulation film 25 and the gate insulation film 23.

Next, the formation of the wiring 27 which is connected to the floating diffusion FD via the connection hole 25a and the formation of the inter-layer insulation film 25 are repeated. The wiring 27 is formed using a metallic material having favorable conductivity, such as aluminum, tungsten, or molybdenum. The uppermost inter-layer insulation film 25 is constituted of a film with favorable properties for embedding, and is formed into a flat surface.

A wiring layer 21 is thereby formed that includes the gate insulation film 23, the transfer gate TG, and multiple layers of the wiring 27, the multiple layers being insulated by the inter-layer insulation film 25.

A transistor Tr, a capacitive element, and wiring constituting the pixel circuits and peripheral circuits are formed by the above steps in the semiconductor substrate 31a and the wiring layer 21.

The steps for forming the wiring layer 21 may be performed in accordance with an ordinary semiconductor process, and there is no limitation to the sequencing of the steps. For example, a so-called damascene step may be applied to forming the wiring 27; in such a case, the wiring 27 can be formed of a metallic material that is unsuitable for etching processing, such as copper (Cu).

FIG. 3C

Figure 3C:
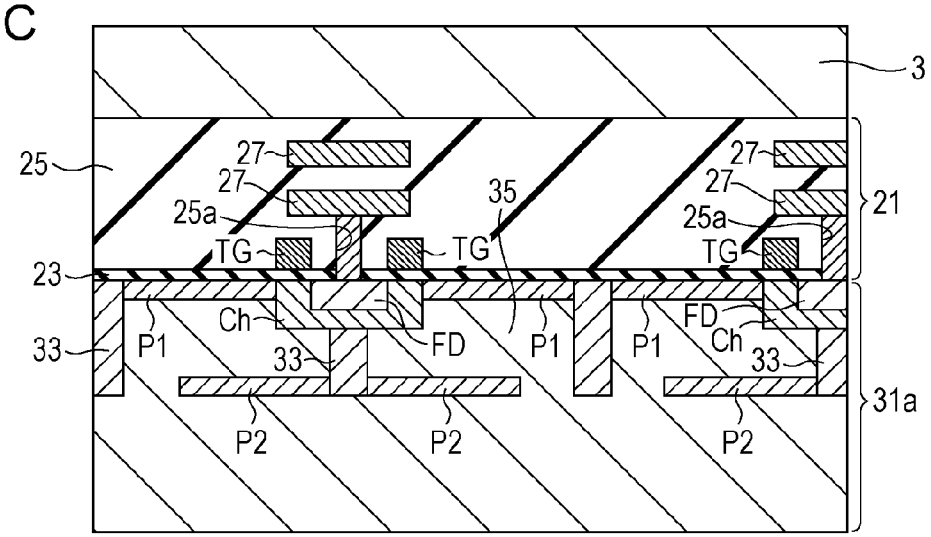

Thereafter, as depicted in FIG. 3C, the support substrate 3 is affixed onto the inter-layer insulation film 25 in the wiring layer 21. The support substrate 3 may be affixed thereonto via an adhesive agent which herein has been omitted from the drawing, or may be affixed by direct bonding that does not use an adhesive agent.

FIG. 4A

Figure 4A:
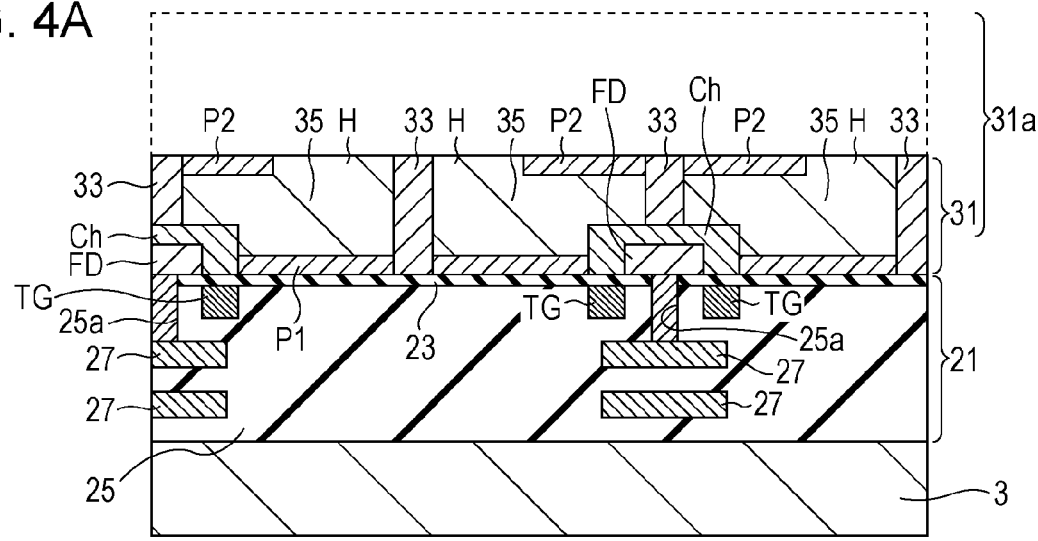
FIGS. 4A to 4C are cross-sectional views illustrating steps (continued from the step in FIG. 3C) of the first example of the production method employed for the first embodiment.

Next, as depicted in FIG. 4A, the semiconductor substrate 31a is thinned from the back surface thereof to provide the semiconductor layer 31. Herein, the semiconductor substrate 31a is thinned from the side opposite to the support substrate 3, until the second pinning layer P2 and also the charge accumulation unit 35 are exposed, to provide the semiconductor layer 31. Thereupon, polishing or etching, in which the second pinning layer P2 serves as an etching stopper, is performed to thin the semiconductor substrate 31a.

FIG. 4B

Figure 4B:
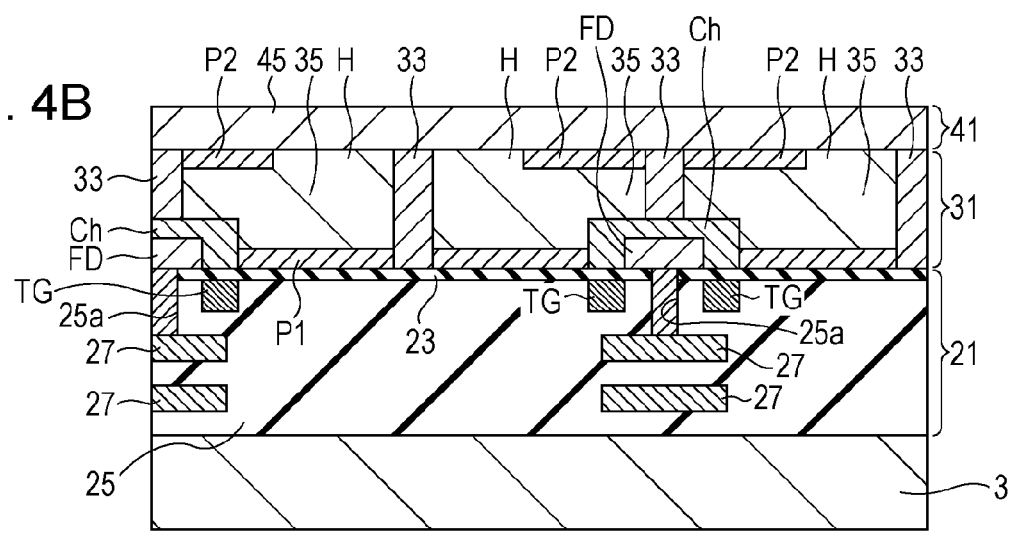

Thereafter, as depicted in FIG. 4B, the photoelectric conversion film 41 is deposited onto the exposed surface of the semiconductor layer 31. The deposition of the photoelectric conversion film 41 is achieved by an appropriate method for deposition, using the various materials described above constituting the photoelectric conversion film 41.

For example, in a case in which a photoelectric conversion film 41 made up of a compound semiconductor having a chalcopyrite structure is formed so as to be lattice-matched to the semiconductor layer 31, epitaxy is used to deposit the photoelectric conversion film 41 on the semiconductor layer 31. A photoelectric conversion film 41 having a crystalline structure is thereby deposited in a state of being lattice-matched to the semiconductor layer 31 made up of single-crystal silicon. The deposition of such a photoelectric conversion film 41 by epitaxial growth is achieved by chemical vapor deposition (CVD), which uses a deposition gas containing each element constituting the photoelectric conversion film 41, or by molecular beam epitaxy (MBE).

For example, in a case of depositing a photoelectric conversion film 41 using $Cu(Ga_{0.52}In_{0.48})S_2$ having a chalcopyrite structure, the deposition includes the addition of Zn, which is an n-type impurity, to the p-type $Cu(Ga_{0.52}In_{0.48})S_2$. Thereupon, the deposition includes adjusting the amount of Zn-containing deposition gas supplied, such that the Zn concentration is lowered along with the crystalline growth. The photoelectric conversion film 41 thus has a configuration in which the band is inclined so as to facilitate movement of electrons from the p-type photoelectric conversion film 41 to the n-type charge accumulation unit 35.

FIG. 4C

Figure 4C:
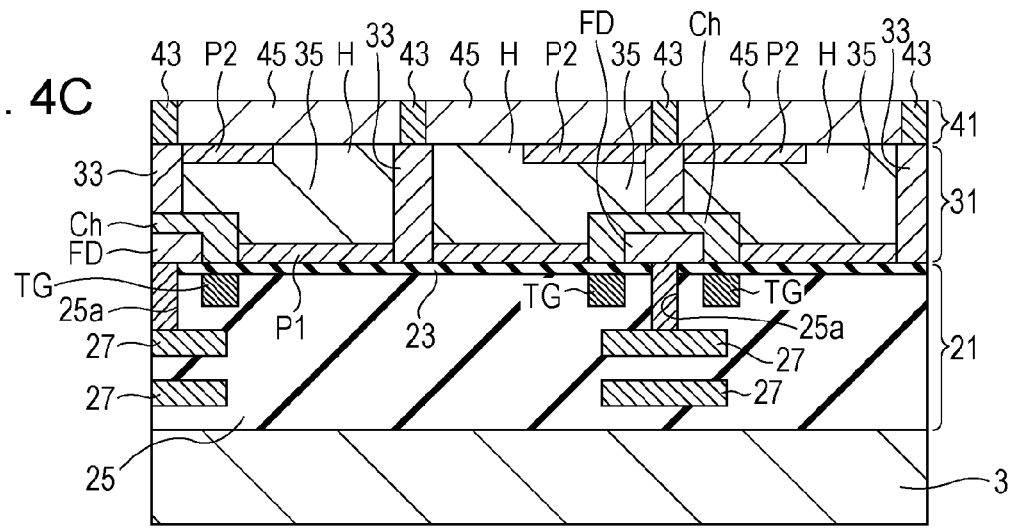

Next, as depicted in FIG. 4C, the element isolation 43 is formed in the photoelectric conversion film 41 to form the photoelectric conversion units 45, formed by the separation of the photoelectric conversion film 41 so as to correspond to pixels. Herein, for example, a mask pattern is formed on the photoelectric conversion film 41 by a lithographic method; a layer of impurities is formed across the depth direction of the photoelectric conversion film 41 by ion implantation from above the mask pattern and by subsequent thermal-activation treatment, thus making the layer into the element isolation 43. Thereupon, when the photoelectric conversion film 41 is of the p-type, then n-type impurities are introduced by ion implantation; when the photoelectric conversion film 41 is of the n-type, then p-type impurities are introduced by ion implantation.

The element isolation 43 may be formed by embedding a groove with an insulation film. In such a case, a shallow trench isolation (STI) is formed, independent of the conductivity type of the photoelectric conversion film 41. Forming the element isolation 43 as a shallow trench isolation is preferred because the necessity of performing thermal-activation treatment of the impurities for forming the element isolation 43 is eliminated.

FIG. 2

Following the above, as has first been illustrated in FIG. 2, the protective film 51 is deposited onto the photoelectric conversion film 41 constituting the photoelectric conversion units 45. The protective film 51, as has been described above, may be a film of a passivating material, or otherwise may be a film of a material having a fixed charge in order to compensate for the defect level of the surface of the photoelectric conversion film 41.

Next, the color filter layer 53 is formed on the protective film 51 by pattern formation such that the filters having colors correspond to the photoelectric conversion units 45; the on-chip lenses 55 are also formed. The solid-state imaging element 1a is thus obtained.

The first example of the production method as described above makes it possible to obtain a solid-state imaging element of the first embodiment, in which the second pinning layer P2 is provided in a region of the charge accumulation unit 35 made up of the semiconductor layer 31, the region being located at the interface between the charge accumulation unit 35 and the photoelectric conversion unit 45 made up of the photoelectric conversion film 41, as has been described using FIG. 2. According to the particular sequence of this first example, there is a step for forming impurity layers including the charge accumulation units 35 in the semiconductor substrate 31a constituting the semiconductor layer 31, as has been described using FIG. 3A, following which, as has been described using FIG. 3B, the wiring 27 is formed on the semiconductor substrate 31a. It is therefore possible to maintain the quality of the wiring 27 without the wiring 27 being affected by thermal-activation treatment at high temperatures for forming the impurity layers. Forming the element isolation 43 formed in the photoelectric conversion film 41 as a shallow trench isolation further makes it possible to minimize the influence of thermal-activation treatment on the wiring 27 and to maintain the quality of the wiring 27, because the necessity of performing thermal-activation treatment of the impurities for forming the element isolation 43 is eliminated.

4: A Second Example of the Method for Producing the Solid-State Imaging Element of the First Embodiment FIGS. 5A to 6C are cross-sectional views serving to describe the steps of a second example of the method for producing the solid-state imaging element of the first embodiment. The point of difference between this second example and the previously described first example lies in the timing for forming the second pinning layer P2 in the overall process; the sequence is otherwise similar. The following is a description of the second example of the method for producing the solid-state imaging element of the first embodiment on the basis of FIGS. 5A to 6C. Note that a detailed description of steps overlapping with those of the first example has been omitted.

FIG. 5A

Figure 5A:
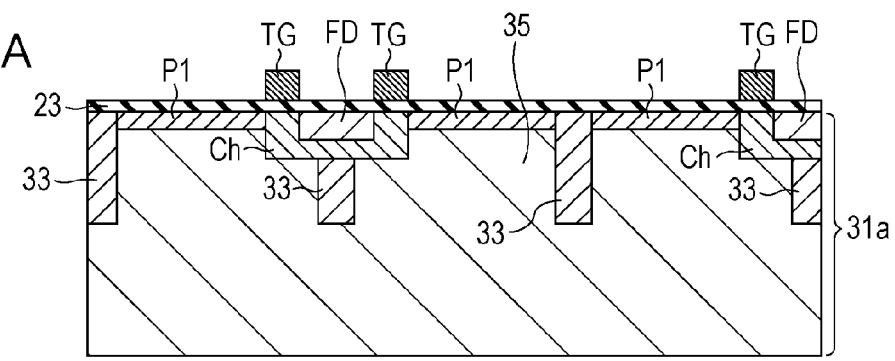
FIGS. 5A to 5C are cross-sectional views illustrating steps of a second example of the production method employed for the first embodiment.

First, as illustrated in FIG. 5A, for example, an n-type single-crystal silicon substrate is prepared as the semiconductor substrate 31a.

Impurity layers other than the second pinning layer P2 are formed in the surface layer of this semiconductor substrate 31a. That is, the element isolation 33 and the first pinning layer P1 made up of p+-type impurity layers are formed, and the channel region Ch made up of a p-type impurity layer is also formed. The floating diffusion FD and the charge accumulation unit 35, made up of n+-type impurity layers, are also formed. Note that herein, the surface layer of the semiconductor substrate 31a, which is surrounded by the channel region Ch, serves as the charge accumulation unit 35.

Each of these p+-type impurity layers, p-type impurity layer, and n+-type impurity layers is formed by ion implantation into the semiconductor substrate 31a from above a mask and by subsequent thermal-activation treatment; in particular, the ion implantation is performed by appropriately setting the implantation energy to match the depth of each impurity layer.

Next, the gate insulation film 23 constituted by a silicon oxide film or a silicon nitride film is deposited onto the surface of the semiconductor substrate 31a in which the charge accumulation unit 35 has been formed, and the transfer gate TG made up of polysilicon is further formed on the gate insulation film 23.

FIG. 5B

Figure 5B:
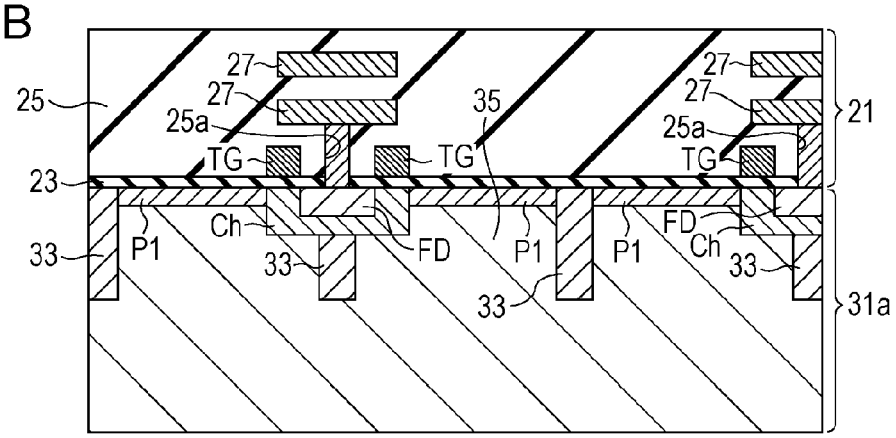

Next, as illustrated in FIG. 5B, the wiring layer 21 is formed on the semiconductor substrate 31a. The wiring layer 21 includes the inter-layer insulation film 25; the connection hole 25a, which reaches the floating diffusion FD; and the wiring 27 that is connected to the floating diffusion FD via the connection hole 25a. The transistor Tr, the capacitive element, and the wiring that constitute the pixel circuits and the peripheral circuits are thereby formed in the semiconductor substrate 31a and the wiring layer 21.

FIG. 5C

Figure 5C:
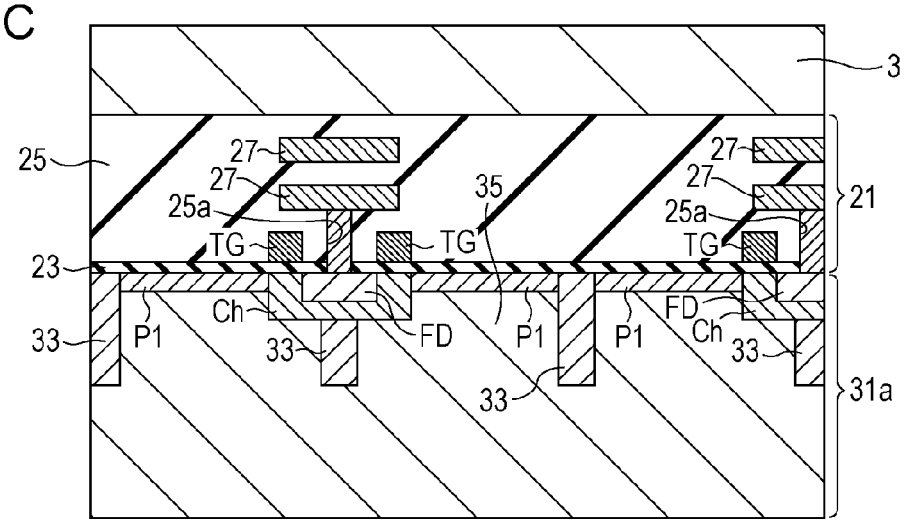

Thereafter, as illustrated in FIG. 5C, the support substrate 3 is affixed onto the inter-layer insulation film 25 in the wiring layer 21. The support substrate 3 is affixed via an adhesive agent, which herein has been omitted from the drawing.

FIG. 6A

Figure 6A:
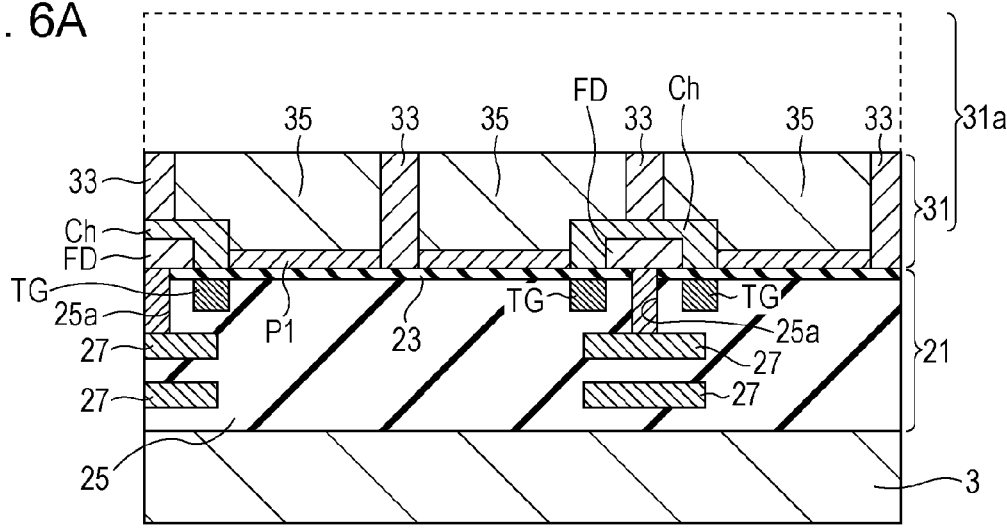
FIGS. 6A to 6C are cross-sectional views illustrating steps (continued from the step in FIG. 5C) of the second example of the production method employed for the first embodiment.

Next, as illustrated in FIG. 6A, the semiconductor substrate 31a is thinned from the back surface thereof such that the charge accumulation unit 35 is left to thereby form the semiconductor layer 31. Herein, the semiconductor substrate 31a is thinned so as to take on the necessary film thickness to serve as the charge accumulation unit 35.

FIG. 6B

Figure 6B:
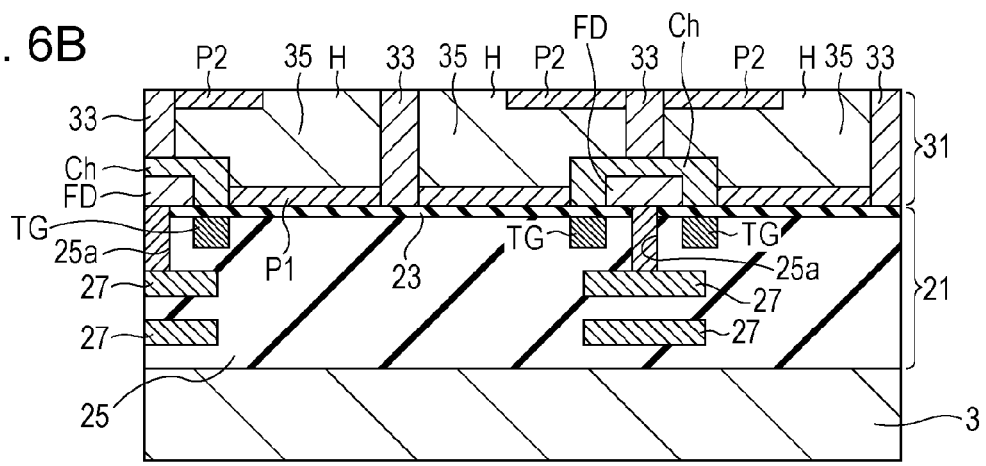

Thereafter, as illustrated in FIG. 6B, the second pinning layer P2 made up of a p+-type impurity layer is formed in the exposed surface layer of the semiconductor layer 31 made up of single-crystal silicon—that is, in the exposed surface layer of the charge accumulation unit 35 made up of an n+-type impurity layer. The second pinning layer P2 is formed by introducing impurities from the exposed surface side of the semiconductor layer 31—for example, by ion implantation into the semiconductor layer 31 from above a mask covering portions corresponding to the openings H, and by subsequent thermal-activation treatment. The implantation energy of this ion implantation is kept low so as to form the second pinning layer P2 only in the uppermost surface region of the semiconductor layer 31.

The thermal-activation treatment of the impurities for forming the second pinning layer P2 can be performed by laser annealing.

FIG. 6C

Figure 6C:
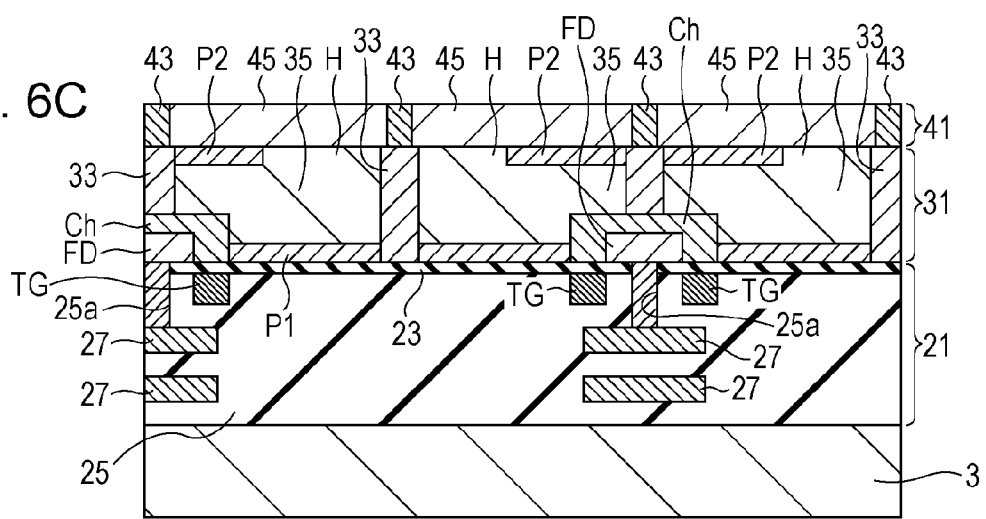

After the above, as illustrated in FIG. 6C, the photoelectric conversion film 41 is deposited onto the exposed surface of the semiconductor layer 31. For example, in a case in which a photoelectric conversion film 41 made up of a compound semiconductor having a chalcopyrite structure is formed so as to be lattice-matched to the semiconductor layer 31, epitaxy is used to deposit the photoelectric conversion film 41 on the semiconductor layer 31.

Herein, similar to the first example described above, in a case in which, for example, a photoelectric conversion film 41 composed of $Cu(Ga_{0.52}In_{0.48})S_2$ having a chalcopyrite structure is to be deposited, then the deposition includes adding Zn, which is an n-type impurity, to p-type $Cu(Ga_{0.52}In_{0.48})S_2$. Thereupon, the deposition includes adjusting the amount of Zn-containing deposition gas supplied, such that the Zn concentration is lowered along with the crystalline growth. The photoelectric conversion film 41 thus has a configuration in which the band is inclined so as to facilitate movement of electrons from the p-type photoelectric conversion film 41 to the n-type charge accumulation unit 35.

Thereafter, the element isolation 43 is formed in the photoelectric conversion film 41 to form the photoelectric conversion units 45, formed by the separation of the photoelectric conversion film 41 so as to correspond to pixels. Note that the element isolation 43 may be formed by embedding a groove with an insulation film. In such a case, a shallow trench isolation (STI) is formed, independent of the conductivity type of the photoelectric conversion film 41. Forming the element isolation 43 as a shallow trench isolation is preferred because then the necessity of performing thermal-activation treatment of the impurities for forming the element isolation 43 is eliminated.

FIG. 2

Following the above, as has first been illustrated in FIG. 2, the protective film 51 is deposited onto the photoelectric conversion film 41 constituting the photoelectric conversion units 45. The protective film 51, as has been described above, may be a film of a passivating material, or otherwise may be a film of a material having a fixed charge in order to compensate for the defect level of the surface of the photoelectric conversion film 41.

Next, the color filter layer 53 is formed on the protective film 51 by pattern formation such that filters having colors correspond to the photoelectric conversion units 45; the on-chip lenses 55 are also formed. The solid-state imaging element 1a is thus obtained.

The second example of the production method as described above makes it possible to obtain a solid-state imaging element of the first embodiment, in which the second pinning layer P2 is provided in a region of the charge accumulation unit 35 made up of the semiconductor layer 31, the region being located at the interface between the charge accumulation unit 35 and the photoelectric conversion unit 45 made up of the photoelectric conversion film 41, as has been described using FIG. 2. According to the particular sequence of this second example, as has been described using FIG. 6B, the second pinning layer P2 is formed by the introduction of impurities into the exposed surface layer of the semiconductor layer 31, formed by thinning the semiconductor substrate 31a. The depth profile of the impurities for forming the second pinning layer P2 can therefore be prevented from expanding, allowing for the formation of an ultra-thin second pinning layer P2 in the exposed surface layer of the semiconductor layer 31. There is accordingly the expectation of improved blue sensitivity and improved saturation charge amount.

Further, the thermal-activation treatment of the impurities for forming the second pinning layer P2 can be performed by laser annealing, and therefore the high-temperature activation of the second pinning layer P2, which is performed after the formation of the wiring layer 21, can be performed in only the outermost surface. The effect exerted on the wiring 27 by the high-temperature thermal-activation treatment for forming the impurity layer can thereby be minimized, and the quality of the wiring 27 can thereby be maintained. Forming the element isolation 43 formed in the photoelectric conversion film 41 as a shallow trench isolation further makes it possible to minimize the effects of thermal treatment on the wiring 27 and to maintain the quality of the wiring 27, because the necessity of performing thermal-activation treatment of the impurities for forming the element isolation 43 is eliminated.

5: the Configuration of the Solid-State Imaging Element of the Second Embodiment (an Example in which Pinning Openings and Transfer Gates are Superposed)

Figure 7:
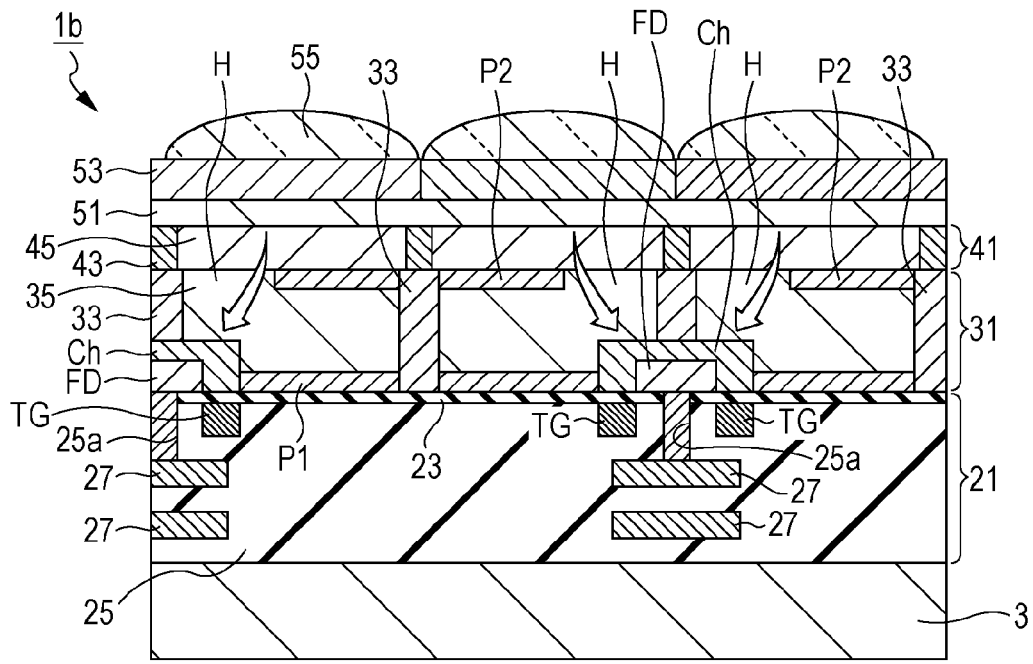
FIG. 7 is a schematic cross-sectional view illustrating the configuration of a solid-state imaging element of a second embodiment.

FIG. 7 is a cross-sectional drawing illustrating a partial configuration of the solid-state imaging element of the second embodiment, and is a cross-sectional diagram of three pixels in the pixel region 5 in FIG. 1. A point of difference between the solid-state imaging element 1b of the second embodiment illustrated in FIG. 7 and the solid-state imaging element of the first embodiment described using FIG. 2 lies in the positions in plan view of the openings H provided in the second pinning layer P2; the configuration is otherwise the same as that of the first embodiment.

Figure 8A:
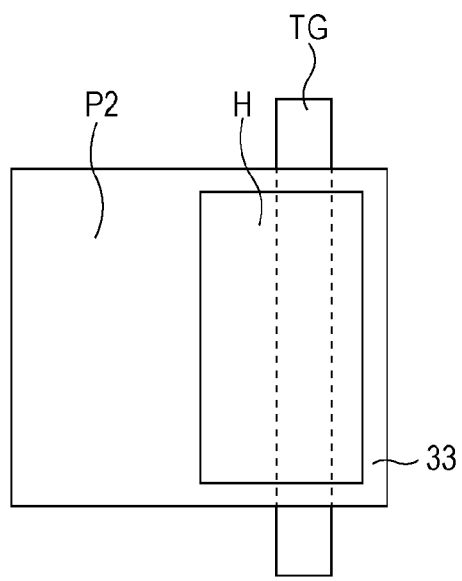
FIGS. 8A and 8B are partial plan views illustrating a state in which a pinning opening overlaps a transfer gate in the solid-state imaging element of the second embodiment.
Figure 8B:
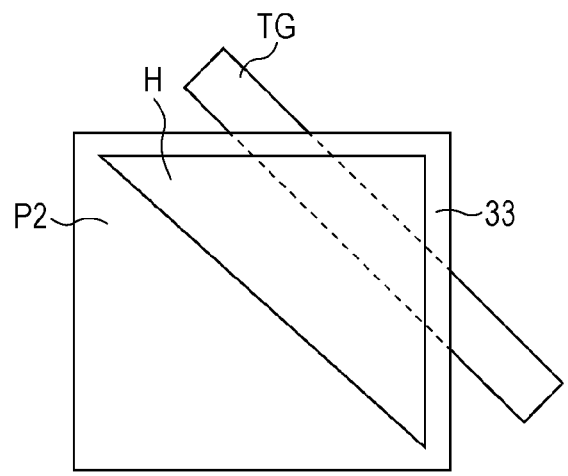

Namely, each opening H of the second pinning layer P2 is arranged such that the opening H and the transfer gate TG provided in the wiring layer 21 are superposed in plan view. FIGS. 8A and 8B illustrate a plan view, viewed from the second pinning layer P2. As illustrated in these drawings, the manner in which the opening H of the second pinning layer P2 and the transfer gate TG are superposed is not limited, and partial superposition will suffice.

In the solid-state imaging element 1b of the second embodiment described above, arranging the opening H of the second pinning layer P2 and the transfer gate TG so as to be superposed minimizes the distance from the opening H to the transfer gate TG. As illustrated by the arrows in FIG. 7, signal charges generated in the photoelectric conversion film 41 are thereby directly read out to the floating diffusion FD through the opening H provided in the second pinning layer P2 by the drive of the transfer gate TG. Accordingly, as has been described in the first embodiment, in addition to the effect of preventing noise generation and improving image quality achieved in the configuration, which succeeds in improving optical sensitivity and in achieving a higher pixel density, it is further possible to achieve the effect of facilitating reading out of charges from the photoelectric conversion unit 45 to improve the response properties.

6: The Configuration of the Solid-State Imaging Element of the Third Embodiment (an Example in which Pinning Openings are Provided in the Centers of Pixels)

Figure 9:
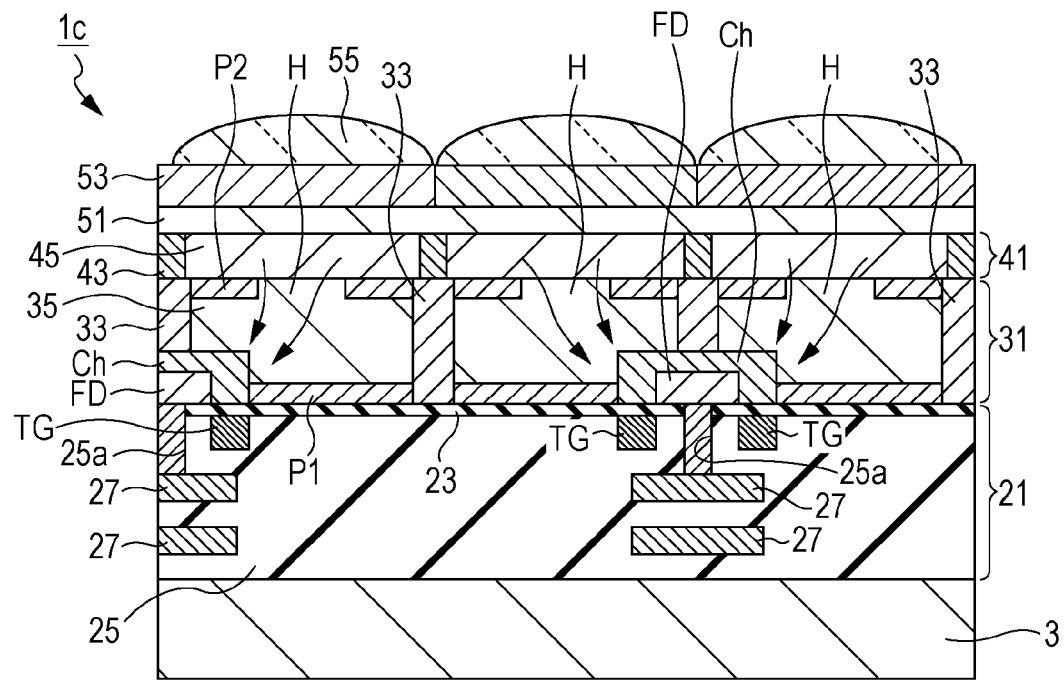
FIG. 9 is a schematic cross-sectional view illustrating the configuration of a solid-state imaging element of a third embodiment.

FIG. 9 is a cross-sectional drawing illustrating a partial configuration of the solid-state imaging element of the third embodiment, and is a cross-sectional diagram of three pixels in the pixel region 5 in FIG. 1. A point of difference between the solid-state imaging element 1c of the third embodiment illustrated in FIG. 9 and the solid-state imaging elements of the previously described first embodiment and second embodiment lies in the positions in plan view of the openings H provided in the second pinning layer P2; the configuration is otherwise the same as that of the first embodiment and second embodiment.

Figure 10A:
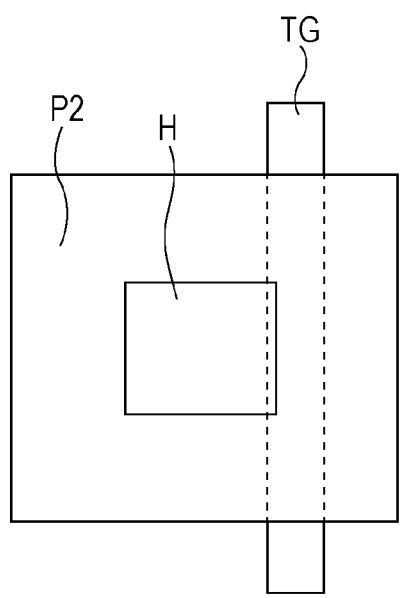
FIGS. 10A and 10B are partial plan views illustrating the position of a pinning opening in the solid-state imaging element of the third embodiment.
Figure 10B:
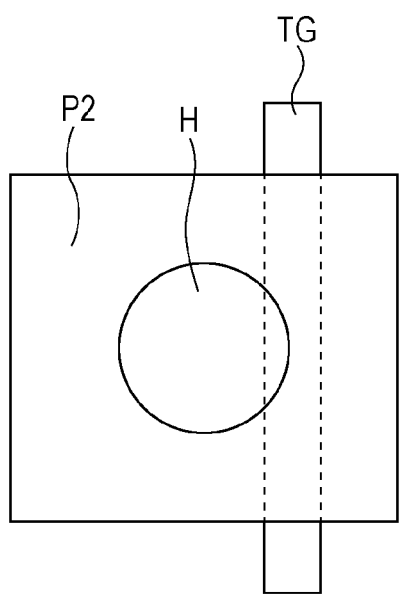

Namely, each opening H of the second pinning layer P2 is arranged in the center of the photoelectric conversion unit 45 in plan view. Herein, the photoelectric conversion unit 45 is formed on the charge accumulation unit 35 so as to substantially match the charge accumulation unit 35. In such a case, the opening H of the second pinning layer P2, being located in the center of the photoelectric conversion unit 45 and the charge accumulation unit 35 is arranged in the center of the pixel. FIGS. 10A and 10B illustrate a plan view, viewed from the second pinning layer P2. As illustrated in these drawings, the shape of the opening H of the second pinning layer P2 may be rectangular, may be circular, or may be another shape; the shape is preferably one that is easy to process. The opening H of the second pinning layer P2 and the transfer gate TG may be superposed, as has been described in the second embodiment.

The solid-state imaging element 1c of the third embodiment described above is configured such that the opening H of the second pinning layer P2 is arranged in the center of the photoelectric conversion unit 45 when seen in plan view. The electric field generated by driving the transfer gate TG is thereby made to have a uniform effect on the entire region of the photoelectric conversion unit 45 via the second pinning layer P2, thus facilitating potential designs. It is therefore possible to efficiently read out signal charges from the entire region of the photoelectric conversion unit 45 to the charge accumulation unit 35. Accordingly, as has been described in the first embodiment, in addition to the effect of preventing noise generation and improving image quality achieved in the configuration, which succeeds in improving optical sensitivity and in achieving a higher pixel density, it is further possible to achieve the effect of efficiently reading out charges from the photoelectric conversion unit 45.

7: An Embodiment of an Electronic Device

The solid-state imaging elements according to the above-described embodiments of the present disclosure can be applied to electronic devices including camera systems, such as digital cameras and video cameras; to cellular phones having an imaging function; and to other devices provided with an imaging function.

Figure 11:
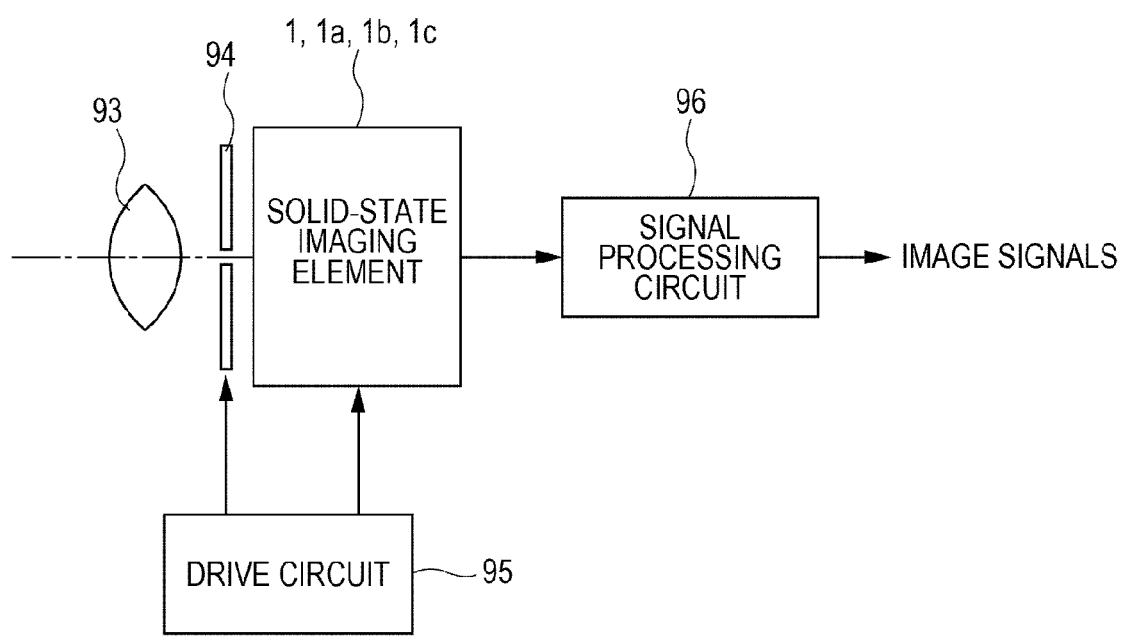
FIG. 11 is a diagram of the configuration of an electronic device.

FIG. 11 illustrates the configuration of a camera including a solid-state imaging element, as an example of an electronic device according to an embodiment of the present disclosure. The camera according to this embodiment takes the example of a video camera capable of still imaging or video imaging. The camera 91 of this embodiment includes a solid-state imaging element 1, an optical system 93 for guiding incident light to a light-receiving sensor unit of the solid-state imaging element 1, a shutter device 94, a drive circuit 95 for driving the solid-state imaging element 1, and a signal processing circuit 96 for processing the outputted signals from the solid-state imaging element 1.

The solid-state imaging element 1 is a solid-state imaging element (1a, 1b, 1c) having one of the configurations described in the above-described embodiments and modifications. The optical system (optical lens) 93 provides the image of image light (incident light) from a subject onto an imaging surface of the solid-state imaging element 1. Signal charges are thereby accumulated in the solid-state imaging element 1 for a certain period. The optical system 93 may be an optical lens system constituted of a plurality of optical lenses. The shutter device 94 controls the time period for illuminating light and the time period for blocking light to the solid-state imaging element 1. The drive circuit 95 supplies drive signals for controlling the transfer operation of the solid-state imaging element 1 and the shutter operation of the shutter device 94. The solid-state imaging element 1 transfers signals using the drive signals (timing signals) supplied from the drive circuit 95. The signal processing circuit 96 runs a variety of signal processing. Image signals that have gone through signal processing are stored in a storage medium such as memory, or alternatively are outputted to a monitor.

In the electronic device according to this embodiment described above, the use of the solid-state imaging element 1 according to one of the embodiments, which is able to improve optical sensitivity and image quality while at high density, makes it possible to succeed in size reduction of the electronic device and improvement of the quality of captured images.

The present disclosure contains subject matter related to that disclosed in Japanese Priority Patent Application JP 2011-014110 filed in the Japan Patent Office on Jan. 26, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging element comprising:
a semiconductor layer;
a wiring layer at one surface of the semiconductor layer;
a photoelectric conversion film on an oppositely facing surface of the semiconductor layer,
a charge accumulation unit in the semiconductor layer and between the photoelectric conversion film and the wiring layer; and
a pinning layer of a conductivity type opposite to a conductivity type of the charge accumulation unit between the photoelectric conversion film and the charge accumulation unit and at an interface between the charge accumulation unit and the photoelectric conversion film, the pinning layer including an opening.

2. The solid-state imaging element according to claim 1, wherein:
a floating diffusion is provided in a region of the semiconductor layer, the region being located at an interface between the semiconductor layer and the wiring layer; and
a transfer gate is provided in a region of the wiring layer, the region being located at the interface between the semiconductor layer and the wiring layer, such that the transfer gate corresponds to a region located between the charge accumulation unit and the floating diffusion with a gate insulation film being provided between the transfer gate and the semiconductor layer.

3. The solid-state imaging element according to claim 2, wherein the opening and the transfer gate are provided so as to be superposed in plan view.

4. The solid-state imaging element according to claim 2, wherein the opening and the transfer gate are provided so as not to be superposed in plan view.

5. The solid-state imaging element according to claim 1, wherein:
the solid-state imaging element comprises plural charge accumulation units,
the photoelectric conversion film is separated into photoelectric conversion units that are isolated from each other and respectively correspond to the charge accumulation units;
the pinning layer comprises plural openings, and
the openings of the pinning layer are located in centers of the photoelectric conversion units in plan view.

6. The solid-state imaging element according to claim 1, wherein the photoelectric conversion film is composed of a material having a higher absorption coefficient for visible light than the semiconductor layer.

7. The solid-state imaging element according to claim 1, wherein:
the semiconductor layer is composed of single-crystal silicon; and
the photoelectric conversion film is provided so as to be lattice-matched to the semiconductor layer.

8. The solid-state imaging element according to claim 1, wherein another pinning layer of a conductivity type opposite to the conductivity type of the charge accumulation unit is provided in a region of the charge accumulation unit, the region being located at an interface between the charge accumulation unit and the wiring layer.

9. A method for producing a solid-state imaging element, comprising:
forming a charge accumulation unit in a front surface of a semiconductor substrate;
forming a wiring layer on the front surface of the semiconductor substrate in which the charge accumulation unit has been formed;
thinning the semiconductor substrate from a back surface of the semiconductor substrate until the charge accumulation unit is exposed to provide a semiconductor layer having an exposed surface;
forming a photoelectric conversion film on the exposed surface of the semiconductor layer; and
prior to the formation of the photoelectric conversion film, forming a pinning layer of a conductivity type opposite to a conductivity type of the charge accumulation unit, the pinning layer including an opening, in a region of the charge accumulation unit, the region being located at an interface between the charge accumulation unit and the photoelectric conversion film.

10. The method according to claim 9, wherein:
the pinning layer is formed by introducing impurities through the front surface of the semiconductor substrate prior to the formation of the wiring layer; and
the semiconductor substrate is thinned from the back surface of the semiconductor substrate until the pinning layer is exposed and the charge accumulation unit is also exposed through the opening of the pinning layer to provide the semiconductor layer.

11. The method according to claim 9, wherein the pinning layer is formed by introducing impurities into an exposed surface layer of the semiconductor layer after the semiconductor substrate is thinned to provide the semiconductor layer.

12. The method according to claim 9, wherein:
the semiconductor layer is composed of single-crystal silicon; and
the photoelectric conversion film is formed by epitaxial growth of the photoelectric conversion film on the semiconductor layer.

13. An electronic device comprising:
a solid-state imaging element;
an optical system for guiding incident light to a pixel region of the solid-state imaging element; and
a signal processing circuit for processing outputted signals from the solid-state imaging element,
wherein the solid-state imaging element includes
 a semiconductor layer,
 a wiring layer at one surface of the semiconductor layer,
 a photoelectric conversion film on an oppositely facing surface of the semiconductor layer,
 a charge accumulation unit in the semiconductor layer and between the photoelectric conversion film and the wiring layer, and
 a pinning layer of a conductivity type opposite to a conductivity type of the charge accumulation unit between the photoelectric conversion film and the charge accumulation unit and at an interface between the charge accumulation unit and the photoelectric conversion film, the pinning layer including an opening.

* * * * *